United States Patent [19]

Machida et al.

[11] Patent Number: 5,041,897

[45] Date of Patent: Aug. 20, 1991

[54] SEMICONDUCTOR DEVICE

[75] Inventors: Koji Machida; Hideyuki Nakamura, both of Tokyo; Hiroshi Tonegi, Tochigi, all of Japan

[73] Assignees: Seikosha Co., Ltd.; Nippon Precision Circuits Ltd., both of Tokyo, Japan

[21] Appl. No.: 599,333

[22] Filed: Oct. 17, 1990

[30] Foreign Application Priority Data

Oct. 24, 1989 [JP] Japan ................... 1-276355

[51] Int. Cl.5 ..................... H01L 27/02; H01L 27/12; H01L 29/34
[52] U.S. Cl. ......................... 357/51; 357/4; 357/54
[58] Field of Search .................. 357/51, 4, 54, 67

[56] References Cited

U.S. PATENT DOCUMENTS 4,428,066  1/1984  Kihara et al. ............... 357/51
4,536,949  8/1985  Takayama et al. ............ 357/51

Primary Examiner—Mark Prenty
Attorney, Agent, or Firm—Jordan and Hamburg

[57] ABSTRACT

A semiconductor device has a fuse element formed on an insulating substrate, and a first insulating layer formed on the substrate and covering the fuse element. Further insulation on the first insulating layer nitride has an opening exposing the region of the first insulating layer above said fuse.

2 Claims, 2 Drawing Sheets 5,041,897

SEMICONDUCTOR DEVICE

FIELD OF THE INVENTION

The present invention relates to a semiconductor device.

BACKGROUND OF THE INVENTION

A conventional thin film fuse for a silicon integrated circuit has a structure as shown in FIG. 3 wherein reference numeral 41 designates a silicon substrate, reference numeral 42 designates a thin film fuse, reference numeral 45 designates a field insulating layer consisting of silicon oxide, reference numeral 47 designates an interlayer insulating layer and reference numeral 48 designates a protective insulating layer consisting of a phosphor-doped silicon oxide.

The total thickness of the inter-layer insulating layer 47 and the protective insulating layer 48 is relatively large, being in the order of about two micrometers. Accordingly, the thin film fuse 42 occasionally exhibits a poor heat-radiation property when it opens upon application of an electric current thereto, and consequently the silicon substrate 41 melts instantaneously or the field insulating layer 47 cracks. Especially, when the thin film fuse 42 is made of a high melting point metal, the temperature at which the fuse opens becomes so high that the above-mentioned tendency is accelerated.

SUMMARY OF THE INVENTION

Accordingly, an object of the present invention is to improve the heat radiating property of a thin film fuse.

Briefly stated, in accordance with the invention, the above problem is solved by providing an opening in the insulating layer or layers above the insulating layer directly on the thin film fuse, the opening having the shape of the thin film fuse.

DESCRIPTION OF THE PREFERRED EMBODIMENTS

Figure 1:
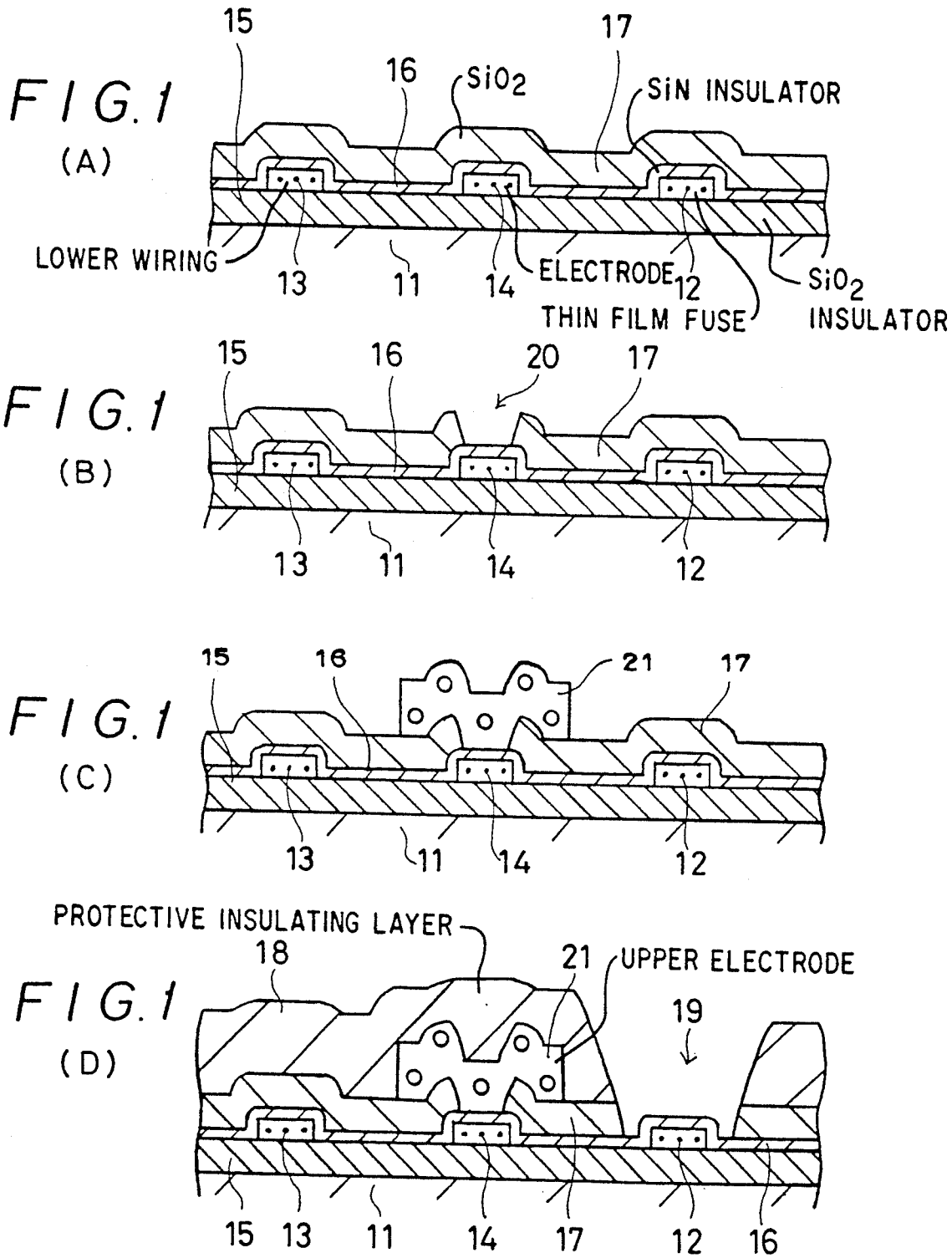
FIGS. 1(A)-1(D) are partial sectional views of a semiconductor device in accordance with one embodiment of the present invention showing the various steps in the manufacture of thee device.

One embodiment of the invention will now be described with reference to the accompanying drawing, wherein FIG. 1 is a vertical partial sectional view of a semiconductor device according to the present invention illustrating how the device is manufactured.

In the figure, reference number 11 designates a silicon substrate for forming a MOS transistor and the like.

Reference numeral 12 designates a thin film fuse.

Reference numeral 13 designates a lower wiring and reference numeral 14 designates a lower electrode for forming a capacitor. These elements consist mainly of molybdenum (Mo) and are formed simultaneously with a gate electrode of an MOS transistor (not shown). The thickness of these elements is in the order of 200 nanometers. The thin film fuse 12 has terminals 22 (FIG. 2) at opposite ends thereof, and opens when a predetermined amplitude of electric current is applied across the terminals.

Reference numeral 15 designates a field insulating layer which represents a first insulating layer. This layer 15 consists of silicon oxide and has a thickness of 500 nanometers.

Reference numeral 16 designates a silicon nitride layer which represents a second insulating layer covering the thin film fuse 12 and has a thickness of 50 nanometers.

Reference numeral 17 designates an inter-layer insulating layer consisting of silicon oxide and having a thickness of 500 nanometers.

Reference numeral 18 designates a protective insulating layer consisting of silicon oxide doped with a suitable amount of phosphor (P), so called PSG, and having a thickness of 1 micrometer.

The inter-layer insulating layer 17 and the protective insulating layer 18 define a third insulating layer.

Figure 2:
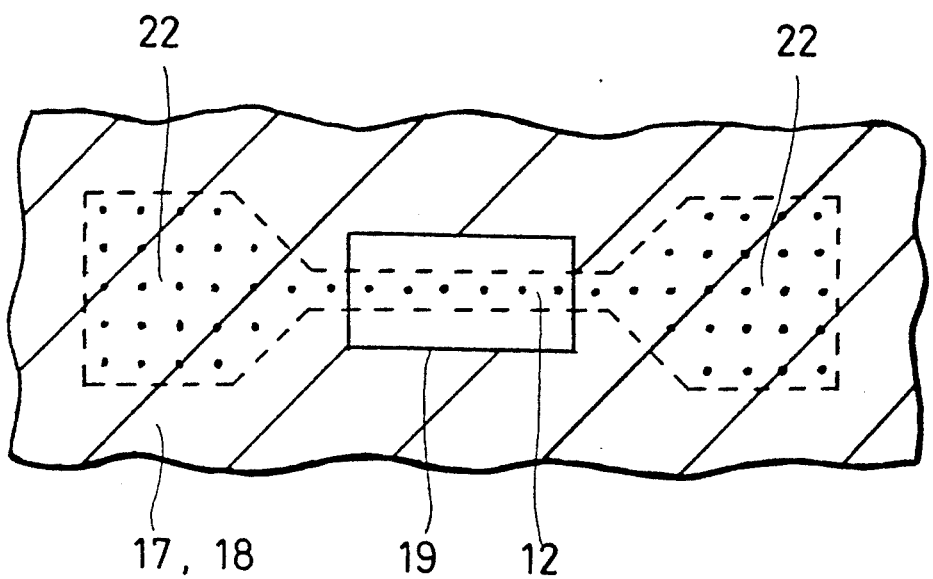
FIG. 2 is a partial plan view of the device shown in FIG. 1.
Figure 3:
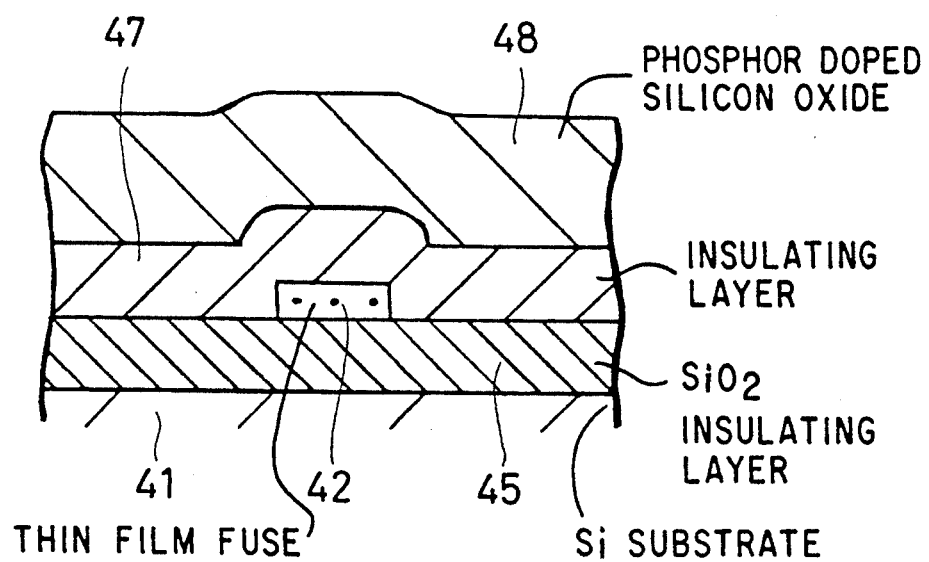
FIG. 3 is a partial sectional view of a conventional semiconductor device.

Reference numeral 19 designates an opening formed to correspond to the shape of the thin film fuse 12. The portion of the third insulating layer other than the opening 1 is covered with the inter-layer insulating layer 17 and the protective insulating layer 18 as shown in FIG. 1(D) and FIG. 2.

Reference numeral 20 designates an opening formed above the lower electrode 14 so as to form a capacitor pattern.

Reference numeral 21 designates an upper electrode for forming the capacitor. This electrode is made of aluminum (Al) of a thickness of 1 micrometer.

The manufacturing process shown in FIG. 1 will now be described in the order of the steps by which the semiconductor device is manufactured.

(A) The field insulating layer 15 is formed over the silicon substrate 11 and a thin molybdenum (Mo) film is formed over the field insulating layer 15 by sputtering. After that, the thin molybdenum film is etched to a predetermined pattern, thereby forming the thin film fuse 12, the lower wiring 13 and the lower electrode 14 for a capacitor. The silicon nitride layer 16 is then formed over the field insulating layer 15 and the thin film fuse 12 by the CVD method. The inter-layer insulating layer 17 is then formed over the silicon nitride layer 16 by the CVD method.

(B) The inter-layer insulating layer 17 is etched with a hydrofluoric acid etchant to provide an opening 20 above upper part of the lower electrode 14.

(C) An aluminum (Al) material is vacuum-evaporated and etched with a phosphoric acid etchant thereby forming the upper electrode 21 for the capacitor.

(D) The protective insulating layer 18 is then formed by the CVD method. Then the protective insulating layer 18 and the inter-layer insulating layer 17 are etched with a hydrofluoric acid etchant to provide the opening 19 corresponding to the shape of the thin film fuse 12, to produce the structure shown in FIGS. 1(D) and 2.

It should be noted that although molybdenum is used for forming the thin film fuse in the above embodiment, other materials mainly consisting of a high melting point metal may be used instead.

According to the present invention, since an opening corresponding to the thin film fuse pattern is formed on the third insulating layer, the heat radiating property of the fuse at the time of its opening is enhanced. Accordingly, it is possible to prevent the silicon substrate from melting instantaneously or the field insulating layer from cracking when the thin film fuse opens. The above described effect is especially effective when the cutting temperature of the fuse becomes extremely high due to the use of a high melting point metal such as molybdenum.

Although the invention is illustrated and described in relationship to specific embodiments, it is nevertheless not intended to be limited to the details shown, since various modifications and structural changes may be made therein without departing from the spirit of the invention and within the scope and range of equivalents of the claims.

What is claimed is:

1. In a semiconductor device comprising a thin film fuse on a first insulating layer, a second insulating layer on said first insulating layer and covering said thin film fuse, and a further insulating layer on said second insulating layer, the improvement wherein said further insulating layer has a hole extending therethrough above said fuse and of the shape of said fuse, thereby exposing said second insulating layer above said fuse, said second insulating layer being silicon nitride.

2. In a semiconductor device comprising a thin film fuse on a first insulating layer, a second insulating layer on said first insulating layer and covering said thin film fuse, and a further insulating layer on said second insulating layer, the improvement wherein said further insulating layer has a hole extending therethrough above said fuse and of the shape of said fuse, thereby exposing said second insulating layer above said fuse, said further insulating layer being comprised of third and fourth insulating layers, said third insulating layer being a silicon oxide layer on said second insulating layer, and said fourth insulating layer being a doped silicon oxide layer.

* * * * *